US 7,555,424 B2

(12) United States Patent
Kfir et al.

(10) Patent No.: US 7,555,424 B2
(45) Date of Patent: Jun. 30, 2009

(54) METHOD AND APPARATUS FOR REWINDING EMULATED MEMORY CIRCUITS

(75) Inventors: Alon Kfir, San Jose, CA (US); Platon Beletsky, San Jose, CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 583 days.

(21) Appl. No.: 11/377,762

(22) Filed: Mar. 16, 2006

(65) Prior Publication Data

US 2007/0219772 A1 Sep. 20, 2007

(51) Int. Cl.
*G06F 9/455* (2006.01)
*G06F 11/16* (2006.01)

(52) U.S. Cl. ............................. 703/24; 703/27; 710/8; 711/6

(58) Field of Classification Search .................. 703/13, 703/24, 27; 710/8; 711/6
See application file for complete search history.

(56) References Cited

U.S. PATENT DOCUMENTS

| 4,306,286 A | 12/1981 | Cocke et al. ............... 364/200 |
| 4,488,354 A | 12/1984 | Chan et al. .................... 29/830 |
| 4,510,602 A | 4/1985 | Engdahl et al. ............... 371/21 |
| 4,583,169 A | 4/1986 | Cooledge .................... 364/300 |
| 4,587,625 A | 5/1986 | Marino, Jr. et al. .......... 364/578 |
| 4,656,580 A | 4/1987 | Hitchcock, Sr. et al. ..... 364/200 |
| 4,675,832 A | 6/1987 | Robinson et al. ............ 364/521 |
| 4,695,968 A | 9/1987 | Sullivan, II et al. ......... 364/578 |
| 4,697,241 A | 9/1987 | Lavi ........................... 364/488 |
| 4,706,216 A | 11/1987 | Carter ......................... 365/94 |
| 4,725,971 A | 2/1988 | Doshi et al. ................. 364/578 |
| 4,744,084 A | 5/1988 | Beck et al. ................... 371/23 |
| 4,758,985 A | 7/1988 | Carter ......................... 365/94 |
| 4,782,440 A | 11/1988 | Nomizu et al. .............. 364/200 |
| 4,862,347 A | 8/1989 | Rudy .......................... 364/200 |
| 4,879,646 A | 11/1989 | Iwasaki et al. .............. 364/200 |
| 4,899,273 A | 2/1990 | Omoda et al. ............... 364/200 |
| 4,901,259 A | 2/1990 | Watkins ....................... 364/578 |

(Continued)

OTHER PUBLICATIONS

Bob Janssens et al., "The Performance of Cache-Based Error Recovery in Multiprocessors", Oct. 1994, IEEE Transactions on Parallel and Distributed Systems, vol. 5, No. 10, pp. 1033-1043.

(Continued)

*Primary Examiner*—Thai Phan
(74) *Attorney, Agent, or Firm*—Orrick, Herrington & Sutcliffe, LLP

(57) ABSTRACT

Methods and apparatus, including computer program products, for emulating a memory circuit in a logic emulation system. The system includes at least one log memory associated with the emulated memory. Each log memory location is marked invalid at a predetermined time. The system receives one or more memory write requests after the predetermined time, each memory write request specifying new data to be written to a specified memory location. If a log memory location corresponding to the specified memory location is marked invalid, a pre-write content of the specified memory location is copied to the corresponding log memory location and the corresponding log memory location is marked as valid, prior to writing the new data at the specified memory location in the emulated memory. The emulated memory is restored to the predetermined time by copying a content of each log memory location marked valid to the emulated memory.

15 Claims, 6 Drawing Sheets

U.S. PATENT DOCUMENTS

| | | | |
|---|---|---|---|
| 4,914,612 A | 4/1990 | Beece et al. | 364/578 |
| 4,937,827 A | 6/1990 | Beck et al. | 371/23 |
| 4,958,324 A | 9/1990 | Devin | 365/201 |
| 5,036,473 A | 7/1991 | Butts et al. | |
| 5,068,812 A | 11/1991 | Schaefer et al. | 364/578 |
| 5,109,353 A | 4/1992 | Sample et al. | 364/580 |
| 5,126,966 A | 6/1992 | Hafeman et al. | 364/500 |
| 5,329,471 A | 7/1994 | Swoboda et al. | 364/578 |
| 5,339,262 A | 8/1994 | Rostoker et al. | 364/578 |
| 5,386,550 A | 1/1995 | Yumioka et al. | 395/575 |
| 5,425,036 A | 6/1995 | Liu et al. | 371/23 |
| 5,448,496 A | 9/1995 | Butts et al. | 364/489 |
| 5,452,239 A | 9/1995 | Dai et al. | 364/578 |
| 5,455,929 A | 10/1995 | Bosshart et al. | 395/500 |
| 5,475,830 A | 12/1995 | Chen | 395/500 |
| 5,530,958 A | 6/1996 | Agarwal et al. | 395/403 |
| 5,546,562 A | 8/1996 | Patel | 395/500 |
| 5,551,013 A | 8/1996 | Beausoleil | 395/500 |
| 5,568,380 A | 10/1996 | Brodnax et al. | 364/184 |
| 5,574,388 A | 11/1996 | Barbier et al. | 326/41 |
| 5,588,113 A | 12/1996 | Johnson | 395/182.13 |
| 5,596,742 A | 1/1997 | Agarwal et al. | 395/500 |
| 5,604,889 A | 2/1997 | Pickens et al. | 395/500 |
| 5,680,583 A | 10/1997 | Kuijsten | 395/500 |
| 5,754,827 A | 5/1998 | Barbier et al. | 395/500 |
| 5,777,489 A | 7/1998 | Barbier et al. | 326/40 |
| 5,790,832 A | 8/1998 | Barbier et al. | 395/500 |
| 5,819,065 A | 10/1998 | Chilton et al. | 395/500 |
| 5,822,564 A | 10/1998 | Chilton et al. | 395/500 |
| 5,920,712 A | 7/1999 | Kuijsten | 395/500 |
| 5,923,865 A | 7/1999 | Chilton et al. | 395/500 |
| 5,943,490 A | 8/1999 | Sample | 395/500 |
| 5,960,191 A | 9/1999 | Sample et al. | 395/500 |
| 6,035,117 A | 3/2000 | Beausoleil et al. | 395/500.46 |
| 6,051,030 A | 4/2000 | Beausoleil et al. | 395/500.44 |
| 6,061,511 A | 5/2000 | Marantz et al. | 395/500.49 |
| 6,088,773 A | 7/2000 | Kano et al. | 711/161 |
| 6,148,416 A | 11/2000 | Masubuchi | 714/15 |
| 6,446,249 B1 | 9/2002 | Wang et al. | 716/17 |
| 6,622,263 B1 | 9/2003 | Stiffler et al. | 714/13 |
| 6,640,278 B1 * | 10/2003 | Nolan et al. | 711/6 |
| 6,694,385 B1 * | 2/2004 | Fuoco et al. | 710/8 |
| 6,766,428 B2 | 7/2004 | Saulsbury et al. | 711/154 |
| 6,850,916 B1 * | 2/2005 | Wang | 705/64 |
| 7,058,849 B2 | 6/2006 | Erstad | 714/5 |
| 7,440,884 B2 * | 10/2008 | Beletsky et al. | 703/24 |
| 2002/0170015 A1 | 11/2002 | Hornung et al. | |
| 2003/0163763 A1 | 8/2003 | DeLano | 714/5 |
| 2004/0148153 A1 * | 7/2004 | Beletsky et al. | 703/27 |

OTHER PUBLICATIONS

Nicholas S. Bowen et al., "Processor-and Memory-Based Checkpoint and Rollback Recovery", Feb. 1993, IEEE Computer, vol. 26, Issue 2, pp. 22-31.

Mar. 23, 2006, Office Action for U.S. Appl. No. 10/373,558.
Jul. 21, 2006, Office Action for U.S. Appl. No. 10/373,558.
Aug. 20, 2007, Office Action for U.S. Appl. No. 10/373,558.
Mar. 31, 2008, Office Action for U.S. Appl. No. 10/373,558.

* cited by examiner

FIG. 2

METHOD AND APPARATUS FOR REWINDING EMULATED MEMORY CIRCUITS

FIELD

The present disclosure relates generally to hardware logic emulation systems used for verification of integrated circuit and electronic system designs and more particularly to a method and apparatus for rewinding emulated memory circuits.

BACKGROUND

Hardware logic emulation systems are known devices that implement a user's design in a plurality of programmable integrated circuits. Such logic emulation systems are available from various vendors, including Cadence Design Systems, Inc., San Jose, Calif., United States of America, and others. Typical emulation systems utilize either programmable logic chips or processor chips which are programmably interconnected. Examples of hardware logic emulation systems using programmable logic devices can be seen in, e.g., U.S. Pat. Nos. 5,109,353, 5,036,473, 5,475,830 and 5,960,191. U.S. Pat. Nos. 5,109,353, 5,036,473, 5,475,830 and 5,960,191 are incorporated herein by reference. Examples of hardware logic emulation systems using processor chips can be seen in, e.g., U.S. Pat. Nos. 5,551,013, 6,035,117 and 6,051,030. U.S. Pat. Nos. 5,551,013, 6,035,117 and 6,051,030 are incorporated herein by reference.

The design under verification ("DUV") is usually provided in the form of a netlist description of the design. The netlist may have been derived from many sources, including from a hardware description language. A netlist description (or "netlist", as it is often referred to by those of ordinary skill in the art) is a description of the circuit's components and electrical interconnections between the components. The components include all those circuit elements necessary for implementing a logic circuit, such as combinational logic (e.g., gates) and sequential logic (e.g., flip-flops and latches). In prior art emulation systems such as those manufactured and sold by Cadence Design Systems, Inc., the netlist is compiled such that it is placed in a form that can be used by the emulation system. In an FPGA-based emulator, the DUV is compiled into a form that allows the logic gates (both sequential and combinational) to be implemented in the FPGAs. In a processor-based emulation system, the DUV is compiled into a series of statements that will be executed by the processors on the processor chips.

One of the main uses for hardware logic emulation systems is to debug the DUV so that the user's design, once fabricated in actual silicon, contains no functional errors. Circuit designers have used emulators for many years now to perform such debugging because the alternative, simulation, is much slower than emulation. Simulation is a software based approach, in which design and testbench are compiled into machine executable model and executed in workstation or PC. The testbench in an emulator is often represented as a target board, which interacts with the DUV directly.

In order to debug a DUV, the designer needs to look into activities of design signals over time. The reason for this is that digital circuits are driven by one or more clocks, and errors can occur at various transitions of the clocks driving the design, i.e., the DUV. The designer faces at least two issues when evaluating design signals over time. One issue is which signal to observe (i.e., which node in the DUV to observe). A second issue is when to observe the signals (i.e., at what clock transition and/or which confluence of events—sometimes referred to as a trigger). These two issues impose serious challenges to simulation and emulation tools. First, circuit designs are typically very large (e.g., in the order of million gates). Second, the number of signals the designer would like to observe is proportionally large. Third, since the time window in which design signals need to be observed (referred to herein as the "trace window") is hard to predict prior to simulation or emulation, the designer who is debugging a design would prefer the trace window to be as large as possible.

In order to handle these issues, circuit designers have used various approaches. One such approach is to run the DUV in a software simulator. With this approach, progress of simulation is controlled by designer in interactive operation. Designers can run simulation, stop and observe signals, continue, and repeat the process. When simulation stops, designers can check the state of any signal in the design. A second approach is to perform free running simulation with signal dump. With the "free running" approach, simulation is executed freely without user intervention, and signals to be observed during simulation are dumped out during simulation. It is important to note that the signals to be dumped out must be specified before the simulation starts. These simulation approaches, while effective, are very slow. A third approach is to emulate the DUV using an emulator that allows full visibility for a fixed size of trace window. In this approach, the emulator is running freely, and enough data from the DUV is saved for a certain period of time that allows later to reconstruct any desired signal in the DUV. Another approach is to emulate the DUV with an emulator that provides for limited visibility. With this approach, limited information is saved during emulation. Designers might need to run emulation a few times in order to get sufficient information for analysis.

The design verification industry has struggled for many years to provide visibility into DUVs. Prior art emulation systems provided some functionality in this area. Most prior art emulators provided various different methods for "probing" various nodes in the DUV so that the signals at that node were observable. For example, in U.S. Pat. No. 5,425,036 to Liu et al, a method was taught that allowed signals to be probed utilizing the "readback" function present in many FPGAs. In U.S. Pat. No. 5,777,489 to Barbier et al, the FPGA had scan chains fabricated onto the FPGA that allowed for tracing all the state elements on the FPGA. Yet another method is described in U.S. Pat. No. 5,943,490, which programmed scan chains into the FPGA to allow tracing of selected subsets of state elements. In U.S. Pat. No. 6,446,249 to Wang et al, each of the logic elements (which implement the logic in the DUV) has a corresponding probe flip-flop, which can be randomly accessed by a probe sequence memory, the contents of which are read out in probe streams. Alternative approaches are proposed in U.S. Pat. No. 6,061,511 to Marantz et al (and specifically, Col. 6, Lines 21-30), and U.S. patent application Ser. No. 10/373,558 to Beletsky et al.

Because memories are an important part of any DUV, there is a need for a debugging method that allows an emulator to restore all the data stored in any location of the memories in the DUV. There is also a need for a debugging environment that does not require interruption or slow-down of the verification process for storing periodic snapshots.

SUMMARY

The present invention provides methods and apparatus, including computer program products, that implement techniques for rewinding emulated memory circuits.

In one general aspect, the techniques feature emulating a circuit design in a logic emulation system, receiving one or more memory write requests at the logic emulation system subsequent to a predetermined time, receiving a request to rewind the emulation of the circuit design at the logic emulation system, and restoring the emulated memory to the predetermined time in response to the rewind request. The emulated circuit design has logic gates and at least one emulated memory having a plurality of memory locations. The logic emulation system having at least one log memory associated with the emulated memory. The log memory has a plurality of log memory locations and each log memory location is marked invalid at a predetermined time. Each memory write request specifies new data to be written to a specified memory location of the plurality of memory locations in the emulated memory. If a log memory location corresponding to the specified memory location is marked invalid, a pre write content of the specified memory location is copied to the corresponding log memory location. The corresponding log memory location is marked as valid, prior to writing the new data at the specified memory location in response to the memory write request. The emulated memory is restored by copying a content of each log memory location marked valid to the emulated memory.

Implementations of the techniques can include one or more of the following features. Emulating the circuit design can include emulating the circuit design during an emulation time interval that is divided into a sequence of time segments. Each time segment has a segment start time and a segment end time, and the emulation system has a log memory associated with each time segment. Copying the pre write content includes identifying an active log memory associated with each memory write request during a current time segment of the sequence of time segments. Copying the pre write content further includes copying a pre write content of the specified memory location to the corresponding active log memory location, if the memory location is not already marked as valid. The corresponding active log memory location is marked as valid, prior to writing the new data at the specified memory location in response to the memory write request. Receiving the request to rewind the emulation includes receiving a request to rewind the emulation to a start time of the current time segment, and restoring the emulated memory includes copying a content of each active log memory location marked valid to the emulated memory.

Implementations of the techniques can include one or more of the following features. Each log memory location can have an associated first and second valid bits, the first valid bit being used and the second valid bit being unused during a current time segment during which the log memory is active, wherein the first valid bit is unused and the second valid bit is used during a subsequent time segment during which the log memory is active. During the current time segment the first valid bit is used to mark a corresponding active log memory location as being valid, and each of the second valid bits is unused. The second valid bit is reset during a time segment subsequent to the current time segment in which the log memory is inactive. The second valid bits can be reset at a rate of one or more bits for each clock cycle. Restoring the emulated memory to a predetermined time comprises copying the log memory locations marked valid to the emulated memory in reverse time order, starting from the log memory associated with the current time segment and going backwards to the log memory associated with the predetermined time.

Implementations of the techniques can include one or more of the following features. Each log memory can have a first write port and a second write port, where the first write port is used to copy the pre-write content of the specified memory location to the corresponding active log memory location and mark the corresponding log memory location as valid. The second write port is used to copy the content of each emulated memory location to the corresponding log memory location, if the corresponding log memory location is marked as being invalid, and the corresponding log memory location is subsequently marked as being valid. A log memory location marked as being valid during a current time segment is considered to be marked invalid during a subsequent time segment. Restoring the emulated memory to a predetermined time comprises copying the log memory associated with the predetermined time to the emulated memory.

Implementations of the techniques can further include one or more of the following features. Receiving the request to rewind the emulation to a target time preceding the current time segment, and restoring the emulated memory further includes identifying a target log memory associated with the target time segment, and copying a content of each target log memory location marked valid to the emulated memory. The time segments have either an equal number or an unequal number of cycles. Each log memory location of the plurality of log memory location can have one or more associated valid bits that are set to a predetermined value to mark the log memory location as being valid, and that are set to an alternative predetermined value to mark the log memory location as being invalid.

In another aspect, the techniques feature a logic emulation system for emulating a circuit design that includes a memory circuit having a plurality of memory locations. The system includes one or more log memories associated with the emulated memory, and an emulation controller that receives memory write requests. The system emulates the circuit design for an emulation time interval comprising one or more emulation time segments, and each log memory corresponds to an emulation time segment in the emulation time interval. Each memory write request specifies new data to be written to a specified memory location of the plurality of memory locations. A memory write request is received during an active time segment that has a corresponding active log memory. For each memory write request, the emulation controller copies a pre-write content of the specified memory location to a corresponding active log memory location of the active log memory if the active log memory location is marked invalid, and marks the corresponding active log memory location as valid if the active log memory location is marked invalid.

Implementations of the invention include one or more of the following features. The emulation controller copies a content of each log memory location marked valid to the emulated memory in response to receiving a request to rewind the emulated memory to a start time of the active emulation time segment.

The invention can be implemented to realize one or more of the following advantages. The logic emulation system can rewind the emulated memories to restore the data in the emulated memories to a predetermined time in the past. The memory requirements of the logic emulation system are proportional to the size of the emulated memories, and are not dependent on the amount of time that needs to be rewound or on the number of write ports of the emulated memories.

BRIEF DESCRIPTION OF THE DRAWINGS

Reference is made to the accompanying drawings in which are shown illustrative embodiments of aspects of the invention, from which novel features and advantages will be apparent.

FIG. 2 illustrates one embodiment of the log memory.

DETAILED DESCRIPTION OF THE DRAWINGS

Figure 1:
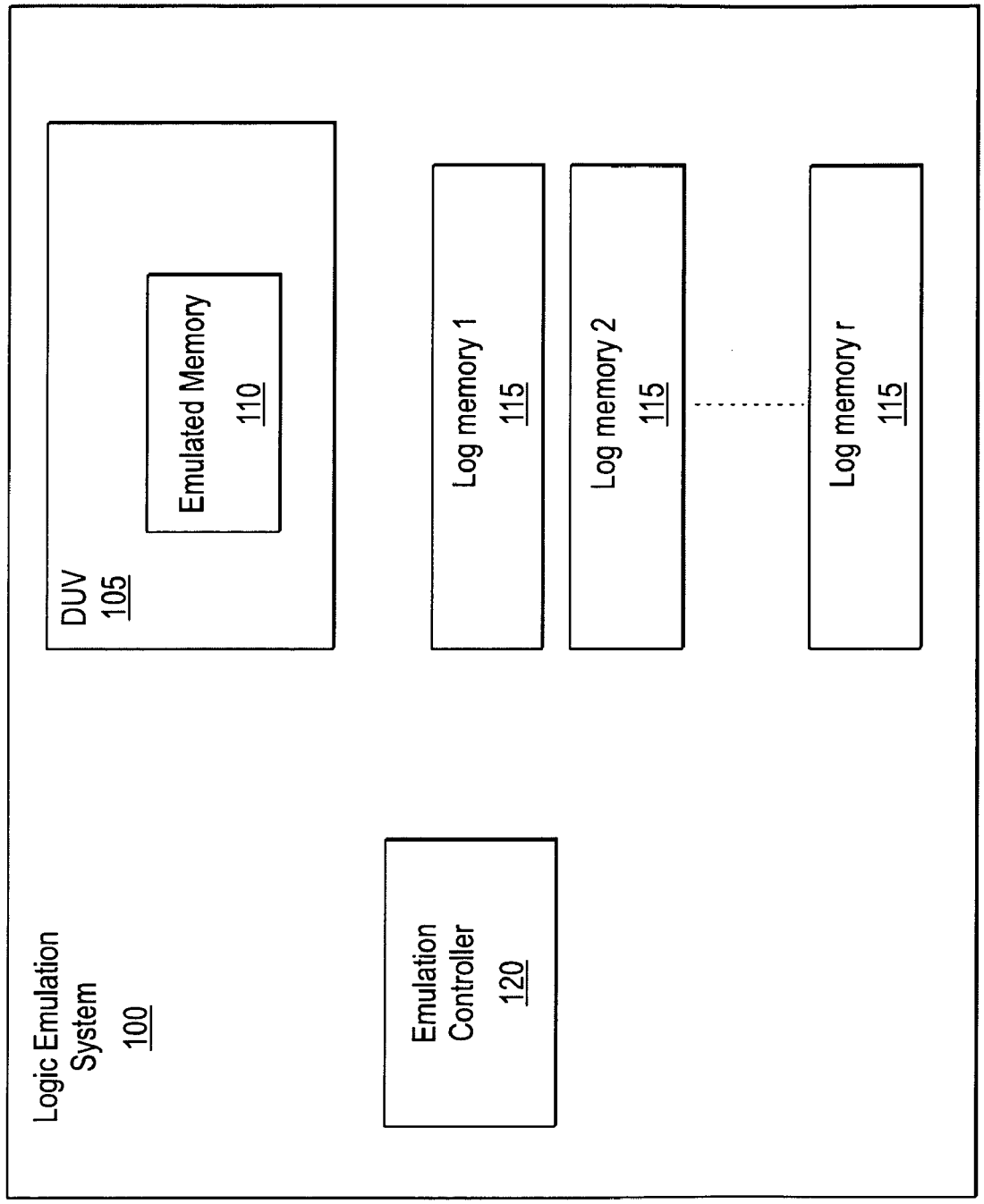
FIG. 1 is a block diagram of an emulation system for a design under verification ("DUV").

FIG. 1 is a block diagram of a logic emulation system 100 for a design under verification ("DUV") 105. The DUV corresponds to a user's design that is being emulated using the emulation system. The DUV includes an emulated memory 110 that corresponds to a memory circuit in the user's design. The emulation system includes one or more log memories 115 that are associated with the emulated memory. The emulation system also includes an emulation controller 120 that controls the operation of the emulated memory and log memories to implement the operations performed by the emulation system.

The emulation system implements two types of operations with regard to the emulated memory—a capture operation, and a restore operation. The capture operation is used to capture emulated memory state at predetermined times during an emulation interval. The restore operation is used to restore the emulated memory contents to a predetermined time during the emulation interval.

Figure 2:
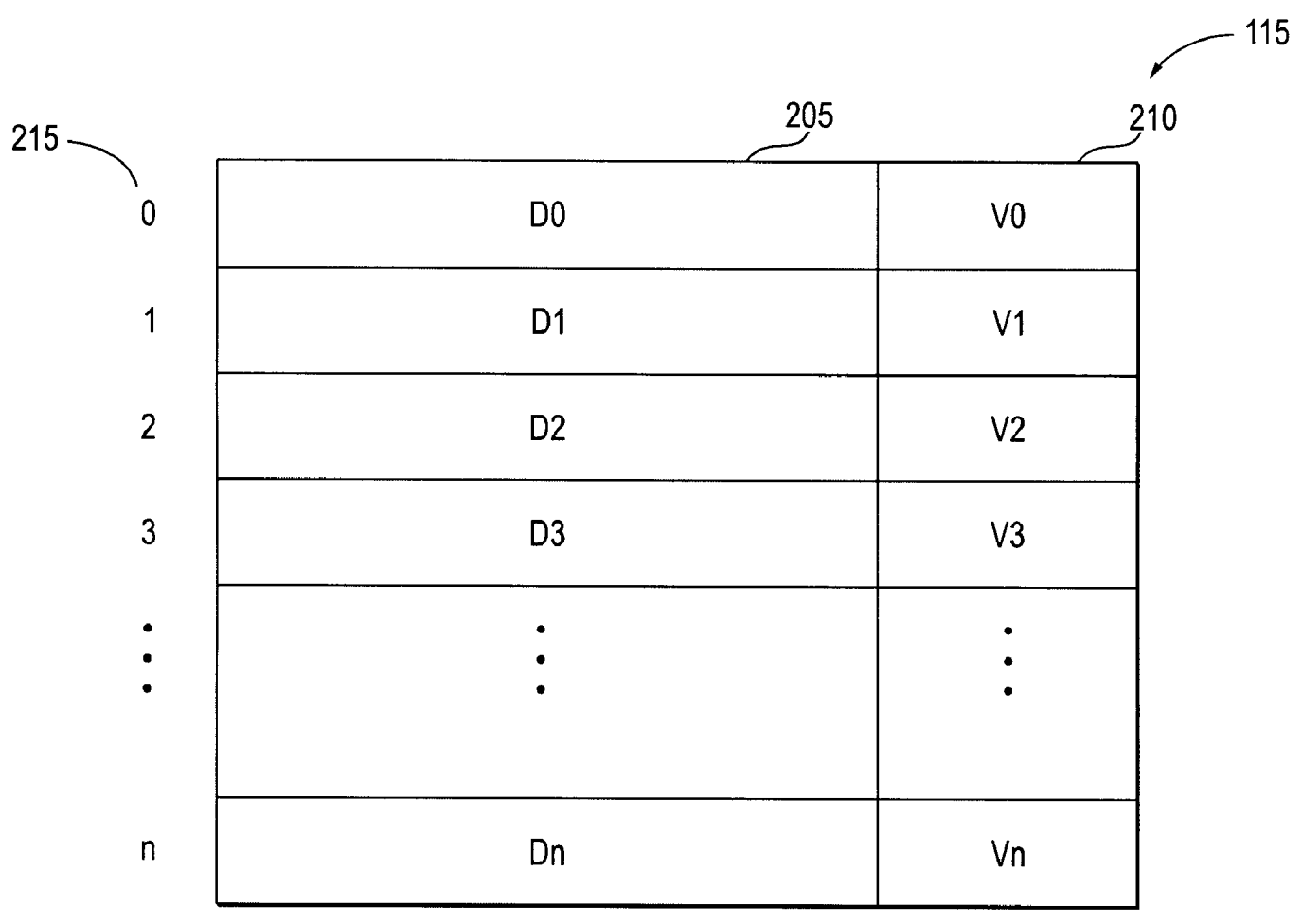

FIG. 2 illustrates one embodiment of the log memory 115. The log memory 115 has a plurality of memory locations 205, where each log memory location 205 corresponds to a location in the associated emulated memory 110. The log memory locations 205 are freely selectable using a log memory address 215. Each log memory location 205 can store one or more bits. In addition, each log memory location 205 has an associated valid tag 210, that indicates whether the log memory location 205 has valid data. In a typical implementation, the valid tag 210 is implemented as either a one bit or two bit value, although in alternative implementations, the valid tag 210 is implemented using a larger number of bits. A log memory location 205 is used to restore the contents of the emulated memory 110 if the associated valid tag 210 indicates that the log memory location 205 has valid data. Log memory locations 205 that are indicated as having invalid data by their associated valid tag are not used to restore the emulated memory contents.

Figure 3:
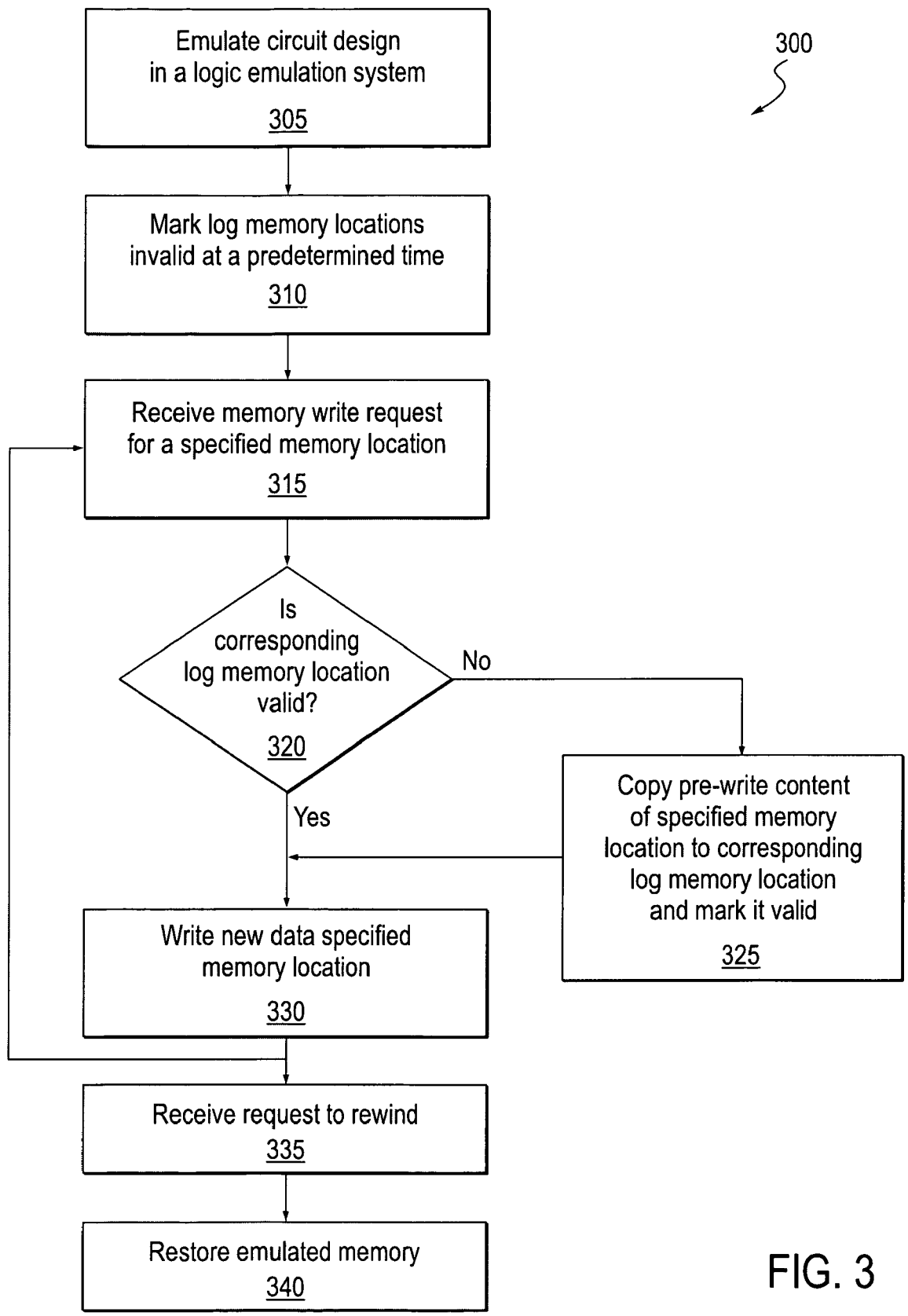
FIG. 3 illustrates a method for capturing and restoring emulated memory contents using one log memory.

FIG. 3 illustrates a method 300 for capturing and restoring a snapshot of the emulated memory contents using one log memory. The emulation system 100 emulates a user's circuit design that includes logic gates and a memory circuit having a plurality of memory locations (step 305). The DUV emulates the user's circuit design and the emulated memory emulates the memory circuit of the user's circuit design. As discussed, the emulation system includes at least one log memory 115 associated with the memory circuit. The log memory 115 has a plurality of log memory locations 205, where each log memory location 205 is marked as being invalid at a predetermined time (step 310). In one implementation, each log memory location 205 has an associated valid tag 210 that is used to mark the location as being valid or invalid. The emulation system 100 receives a memory write request to write new data to a specified memory location (step 315), and in response, determines whether the corresponding log memory location 205 is invalid prior to writing the new data to the specified memory location (step 320). If the corresponding log memory location 205 is valid ("yes" branch of decision step 320), the new data is written to the specified memory location (step 330). If the corresponding log memory location is invalid ("no" branch of decision step 320), a pre-write content of the specified memory location is copied from the emulated memory to the log memory location 205 and the log memory location is marked valid (step 325) prior to writing the new data to the specified memory location, and subsequently, the new data is written to the specified memory location (step 330). Control is returned to step 315 for each additional memory write request that is received at the emulation system 100. After the emulation system 100 receives a request to restore the emulated memory (step 335), the emulated memory contents are restored to the predetermined time (step 340) by copying content of each log memory location marked as being valid to the corresponding emulated memory location.

Figure 4:
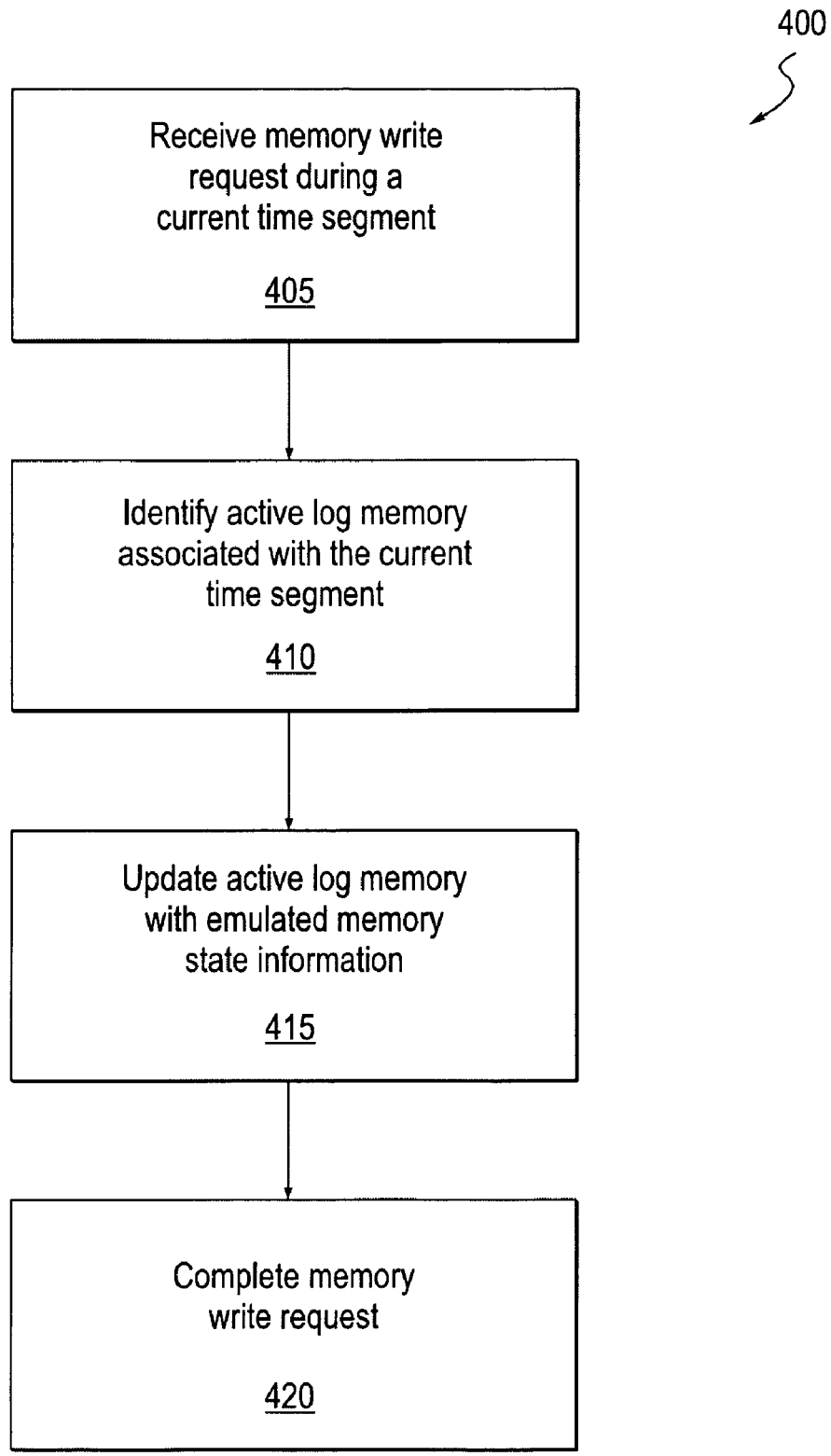
FIG. 4 illustrates a method for capturing emulated memory contents for multiple time segments using multiple log memories.

FIG. 4 illustrates a method 400 for capturing emulated memory contents for multiple time segments using multiple log memories. The emulation time interval is divided into time segments, where each time segment has a segment start time and a segment end time. Each time segment also has an associated log memory 115 that is active during the time segment and stores information regarding the state of the emulated memory during the time segment. All the memory locations of the log memory that is active in a time segment are marked as being invalid at or before the beginning of the time segment. The emulation system 100 receives a memory write request during a current time segment (step 405), and identifies an active log memory 115 associated with the current time segment (step 410). The memory write request specifies new data to be written to a specified location of the emulated memory. The emulation system updates the active log memory 115 with emulated memory state information before writing the new data (step 415). In order to update the active log memory 115, the emulation system 100 determines whether the log memory location 205 corresponding to the specified location is marked as being valid. If the corresponding log memory location 205 is marked as being invalid, the emulation system copies the emulated memory contents for the specified location to the corresponding location in the active log memory 115, and marks the corresponding log memory location 205 as being valid. If the corresponding log memory location 205 is marked as being valid, the active log memory contents are not modified. After the active log memory 205 has been updated, the new data is written to the specified location in accordance with the memory write request (step 420).

Figure 5:
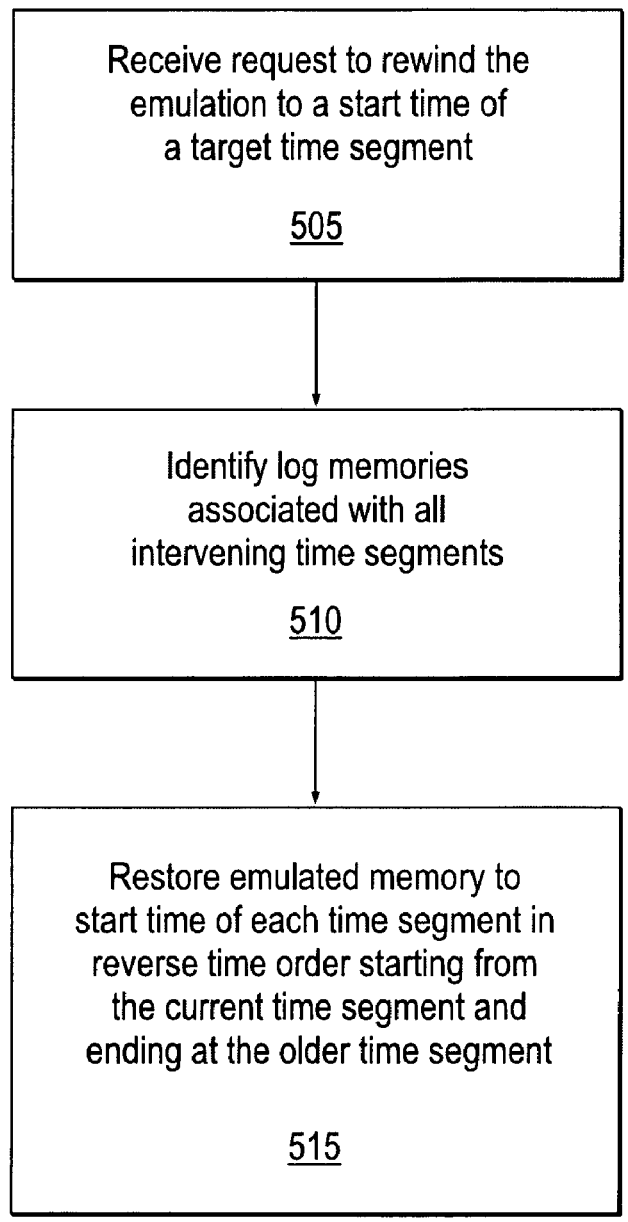
FIG. 5 illustrates a method for restoring emulated memory contents using multiple log memories.

FIG. 5 illustrates a method 500 for restoring emulated memory contents using multiple log memories. The emulation system 100 receives a request to rewind the emulated memory to a start time of a target time segment (step 505). A "rewind" is a request to reset the emulator such that state devices and memory locations have their states restored to values contained therein at a particular point in time. The rewind request is received at a current time within a current time segment. In response to the request, the emulation system 100 identifies log memories associated with the current time segment, the target time segment, and all intervening time segments between the target time segment and the current time segment (step 510). The emulated memory is restored to the start time of the target time segment in reverse order, starting from the current time segment and ending at the target time segment (step 515). The emulated memory is first restored to the start time of the current time segment by copying all memory locations marked as being valid in the log memory associated with the current time segment to the emulate memory. Similarly, the log memory locations 205 marked as being valid for each intervening time segment are copied to the emulated memory, such that the emulated memory is restored to the start time of each intervening time segment in reverse order. Finally, the emulated memory is restored to the start time of the target time segment using the log memory associated with the target time segment.

Figure 6:
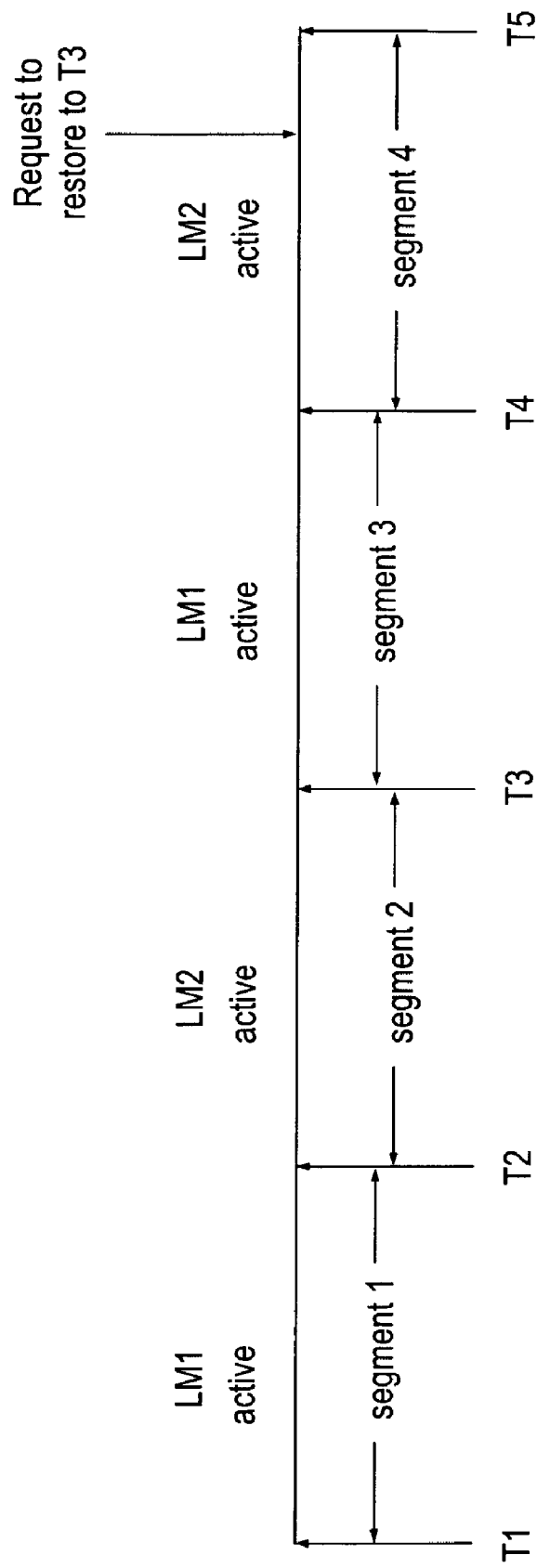
FIG. 6 is a timeline illustrating capturing and restoring emulated memory contents using two log memories.

A typical implementation of the emulation system 100 has a finite number of log memories 115 associated with the emulated memory, and the number of time segments that can be restored is limited to the number of log memories 115 associated with the emulated memory. FIG. 6 is a timeline illustrating the capture and restore of emulated memory contents using two log memories LM1 and LM2. The timeline illustrates four time segments. Segment 1 starts at time T1 and ends at or just before time T2, Segment 2 starts at time T2 and ends at or just before time T3, Segment 3 starts at time T3 and ends at or just before time T4, and Segment 4 starts at time T4 and ends at or just before time T5. Log memory LM1 is active during Segment 1 and Segment 3, and log memory LM2 is active during Segment 2 and Segment 4. A request to restore the emulated memory to time T3 is received during Segment 4. In response, the emulated memory is restored to time T3 by first restoring it to time T4 using log memory LM2, and subsequently restoring the emulated memory to time T3 using log memory LM1.

In one implementation of the log memory, the valid tag is implemented as a one bit tag for each addressable log memory location, where all the valid tags for the log memory are reset before the log memory becomes active for an associated time segment. In an alternative embodiment, the log memory has only one write port and each log memory location has two associated valid bits that represent the valid tag. A first valid bit is used as the valid tag during a particular time segment in which the log memory is active. A second valid bit is reset to invalid during a time segment in which the log memory is inactive. The two valid bits switch roles at each time segment during which the log memory is active, such that the valid bit that was unused during a previous time segment is used as the valid bit during a current time segment, and the bit that was used during the previous time segment is unused and reset to invalid during time segments after the current time segment when the log memory is inactive. The unused valid bits are reset at a rate of one or more unused bit for each clock cycle of the time segment. In this embodiment, in order to restore the emulated memory to a target time segment, the contents of the log memories associated with intervening time segments between the current time segment and the target time segment are copied to the emulated memory in reverse time order, starting from the current time segment and going backwards until the target time segment is reached.

In another implementation of the log memory, the log memory has two write ports, and the valid tag is implemented as a single valid bit associated each addressable log memory location. The first write port of the log memory is used to store emulated memory state information as described in step 415. The second write port of the log memory is used to copy all the contents of the emulated memory to the log memory, in a predetermined (e.g. sequential) order. An emulated memory location is copied to a corresponding log memory location only if the log memory location is marked as being invalid (using the valid tag), and the valid tag for each log memory location is set to valid after the corresponding emulated memory location has been copied. If the time segment is long enough (number of clock cycles in the time segment is not less than the number of addressable log memory locations), then at the end of the time segment during which the log memory is active, each log memory location contains valid data and the valid tag for each log memory location has been set to indicate that the log memory location is valid. In this implementation, the time segments are chosen such that they are longer than the depth of the deepest memory that needs to be rewound, and the only case where not all the memory contents are copied to the log memory is when the emulator is stopped before the scheduled end of the segment. During a subsequent time segment when the log memory is active again, the meaning of the valid tag is inverted, such that if a value of "1" indicated valid and a value of "0" indicated invalid during the previous time segment when the log memory was active, a value of "1" indicates the log memory log memory location is invalid and a value of "0" indicates the log memory location is valid during the current time segment.

In a typical implementation of the emulation system 100, each time segment (e.g., Segment 1 . . . Segment n) includes an equal number of emulation cycles. However in other implementations, the time segments can have different number of emulation cycles execute during each segment. The number of emulation cycles in each time segment is determined by the emulation controller either automatically or based on user input. If the DUV includes more than one emulated memory, the emulation system includes log memories associated with each emulated memory of the DUV that is to be captured and restored. In one implementation, the number of log memories associated with each DUV is different for each DUV. The emulation system either uses the same time segments for capturing and restoring all the emulated memories in the DUV or it uses time segments having a different number of emulation cycles for each emulated memory. For example, one of the emulation memories can be captured and restored using time segments having fewer or more emulation cycles than the time segments used for the other emulation memories in the DUV. The log memories 115 used to capture the state of the emulation memories are either physically separate memories or they are memory buffers that are allocated from a common pool of memory that is available at the emulation system 100. The log memories 115 are either part of the emulation system or they are implemented using memory circuits, such as DRAM, or SRAM memory circuits, that are controlled by the emulation system 100.

Also note that the methods described herein can also be used in other systems for simulating designs such as simulation acceleration engines that use specialized hardware, or software simulators. Some modifications may be necessary, however. For example, when restoring the contents of the memories in a software simulator, the memory restore method can be done by a separate program that is not part of the simulator.

Thus, the various embodiments disclosed herein can be used for either simulating or emulating a digital design. In addition, the various embodiments disclosed herein are useful when emulating a design using test vectors or when the emulator is operating with a target system (i.e., during in circuit emulation).

The various embodiments disclosed herein may take the form of a computer program comprising a series of instructions. These instructions may be supplied on computer usable media. Common forms of computer-usable media include, for example: a floppy disk, flexible disk, hard disk, magnetic tape, any other magnetic medium, CD-ROM, any other optical medium, punchcards, papertape, any other physical medium with patterns of holes, RAM, ROM, PROM (i.e., programmable read only memory), EPROM (i.e., erasable programmable read only memory), including FLASH-EPROM, any other memory chip or cartridge, carrier waves, or any other medium.

Thus, various embodiments of the present invention have been described with particular reference to specific embodiments. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense, and the invention is not to be restricted or limited except in accordance with the following claims and their legal equivalents.

What is claimed is:

1. A method comprising:
    emulating a circuit design in a logic emulation system, the emulated circuit design comprising logic gates and an emulated memory having a plurality of memory locations, the logic emulation system having at least one log memory associated with the emulated memory, the log memory having a plurality of log memory locations, each of the plurality of log memory locations corresponding to a location of the associated emulated memory and being marked invalid at a predetermined time;
    receiving one or more memory write requests at the logic emulation system subsequent to the predetermined time, each memory write request of the one or more memory write requests specifying new data to be written to a specified memory location of the plurality of memory locations in the emulated memory;
    if a log memory location corresponding to the specified memory location is marked invalid, copying a pre-write content of the specified memory location to the corresponding log memory location and marking the corresponding log memory location as valid, prior to writing the new data at the specified memory location of the emulated memory in response to the memory write request;
    receiving a request to rewind the emulation of the circuit design at the logic emulation system; and
    restoring the emulated memory to the predetermined time in response to the rewind request.

2. The method of claim 1, wherein emulating the circuit design comprises emulating the circuit design during an emulation time interval, the emulation time interval being divided into a sequence of time segments, each time segment of the sequence of time segments having a segment start time and a segment end time, the emulation system having a log memory associated with each time segment, all memory locations of the log memory associated with a time segment being marked as invalid prior to the segment start time of the time segment, wherein copying the pre-write content further comprises:
    identifying an active log memory associated with each memory write request, the memory write request being received during a current time segment of the sequence of time segments, the active log memory being the log memory associated with the current time segment; and
    if an active log memory location corresponding to the specified memory location is marked invalid, copying a pre-write content of the specified memory location to the corresponding active log memory location and marking the corresponding active log memory location as valid, prior to writing the new data at the specified memory location in response to the memory write request.

3. The method of claim 2, wherein each log memory location has an associated first valid bit and a second valid bit, the first valid bit being used during a current time segment associated with the log memory, the second valid bit being unused during the current time segment, wherein copying the pre-write content further comprises:
    marking the corresponding active log memory location as valid by setting the first valid bit to indicate a valid value; and
    resetting each second valid bit to indicate an invalid value during a time segment subsequent to the current time segment, in which the log memory is inactive;
    wherein during a subsequent time segment when the log memory is active the second valid bit is used and the first valid bit is unused, and wherein restoring the emulated memory to a predetermined time comprises copying a content of each log memory location marked valid to the emulated memory in reverse time order, starting from the log memory associated with the current time segment and ending at a log memory associated with the predetermined time.

4. The method of claim 2, wherein the log memory has a first write port and a second write port, wherein copying the pre-write content further comprises:
    copying the pre-write content of the specified memory location to the corresponding active log memory location and marking the corresponding active log memory location as valid using the first write port; and
    copying the content of each emulated memory location to the corresponding log memory location using the second write port, if the corresponding log memory location is marked as being invalid, the corresponding log memory location being subsequently marked as being valid;
    wherein a log memory location marked as being valid during a current time segment is considered as being marked invalid during a subsequent time segment when the log memory is active, and wherein restoring the emulated memory to the predetermined time comprises identifying a log memory associated with the predetermined time and copying the contents of the identified log memory to the emulated memory.

5. The method of claim 2, wherein the time segments have an equal number of cycles.

6. The method of claim 2, wherein the time segments do not have an equal number of cycles.

7. The method of claim 1, wherein receiving the request to rewind the emulation comprises receiving the request to rewind the emulation to a start time of a target time segment preceding the current time segment, wherein restoring the emulated memory further comprises:
    identifying a current log memory associated with the current time segment;

copying a content of each current log memory location marked valid to the emulated memory;

identifying a log memory associated with each intervening time segment between the current time segment and the target time segment;

copying a content of each log memory location marked valid to the emulated memory for each identified log memory, the copying being performed in reverse time order of the identified log memories;

identifying a target log memory associated with the target time segment; and copying a content of each target log memory location marked valid to the emulated memory.

8. The method of claim 1, wherein each log memory location of the plurality of log memory locations has one or more associated valid bits, the associated valid bits being set to a predetermined value to mark the log memory location as valid, and the associated valid bits being set to an alternative predetermined value to mark the log memory location as invalid.

9. A logic emulation system for emulating a circuit design comprising a memory circuit, the logic emulation system comprising:

an emulated memory corresponding to the memory circuit, the emulated memory having a plurality of memory locations, each of the plurality of memory locations of the emulated memory corresponding to a location of the emulated memory;

one or more log memories associated with the emulated memory, each log memory of the one or more log memories corresponding to an emulation time segment of one or more emulation time segments, the logic emulation system emulating the circuit design for an emulation time interval comprising the one or more emulation time segments; and an emulation controller, the emulation controller receiving one or more memory write requests, each memory write request of the one or more memory write requests specifying new data to be written to a specified memory location of the plurality of memory locations, the emulation controller copying a pre-write content of the specified memory location to a corresponding active log memory location if the active log memory location is marked invalid, the emulation controller further marking the corresponding active log memory location as valid if the active log memory location is marked invalid;

wherein the memory write request is received during an active emulation time segment of the one or more emulation time segments, the active emulation time segment having a corresponding active log memory of the one or more log memories, the active log memory location being one of a plurality of log memory locations in the active log memory.

10. A computer program product tangibly embodied in a computer readable medium, the computer program product comprising instructions operable to cause a data processing equipment to:

emulate a circuit design in a logic emulation system, the emulated circuit design comprising logic gates and an emulated memory having a plurality of memory locations, the logic emulation system having at least one log memory associated with the emulated memory, the log memory having a plurality of log memory locations, each of the plurality of log memory locations corresponding to a location of the associated emulated memory and being marked invalid at an predetermined time;

receive one or more memory write requests at the logic emulation system subsequent to the predetermined time, each memory write request of the one or more memory write requests specifying new data to be written to a specified memory location of the plurality of memory locations in the emulated memory;

if a log memory location corresponding to the specified memory location is marked invalid, copy a pre-write content of the specified memory location to the corresponding log memory location and marking the corresponding log memory location as valid, prior to writing the new data at the specified memory location of the emulated memory in response to the memory write request;

receive a request to rewind the emulation of the circuit design at the logic emulation system; and restore the emulated memory to the predetermined time in response to the rewind request.

11. The computer program product of claim 10, wherein the instructions for emulating the circuit design comprise instructions operable to emulate the circuit design during an emulation time interval, the emulation time interval being divided into a sequence of time segments, each time segment of the sequence of time segments having a segment start time and a segment end time, the emulation system having a log memory associated with each time segment, wherein the instructions for copying the pre-write content further comprise instructions operable to cause the data processing equipment to:

identify an active log memory associated with each memory write request, the memory write request being received during a current time segment of the sequence of time segments, the active log memory being the log memory associated with the current time segment; and if an active log memory location corresponding to the specified memory location is marked invalid, copy a pre-write content of the specified memory location to the corresponding active log memory location and marking the corresponding active log memory location as valid, prior to writing the new data at the specified memory location in response to the memory write request.

12. The method of claim 11, wherein each log memory location has an associated first valid bit and a second valid bit, the first valid bit being used during a current time segment associated with the log memory, the second valid bit being unused during the current time segment, wherein the instructions for copying the pre-write content further comprise instructions operable to cause the data processing equipment to:

mark the corresponding active log memory location as valid by setting the first valid bit to indicate a valid value; and reset each second valid bit to indicate an invalid value during a time segment subsequent to the current time segment, in which the log memory is inactive;

wherein during a subsequent time segment when the log memory is active the second valid bit is used and the first valid bit is unused, and wherein restoring the emulated memory to a predetermined time comprises copying a content of each log memory location marked valid to the emulated memory in reverse time order, starting from the log memory associated with the current time segment and ending at a log memory associated with the predetermined time.

13. The method of claim 11, wherein the log memory has a first write port and a second write port, wherein the instructions for copying the pre-write content further comprise instructions operable to cause the data processing equipment to:

copy the pre-write content of the specified memory location to the corresponding active log memory location and marking the corresponding active log memory location as valid using the first write port; and copy the content of each emulated memory location to the corresponding log memory location using the second write port, if the corresponding log memory location is marked as being invalid, the corresponding log memory location being subsequently marked as being valid;

wherein a log memory location marked as being valid during a current time segment is considered as being marked invalid during a subsequent time segment when the log memory is active, and wherein restoring the emulated memory to the predetermined time comprises identifying a log memory associated with the predetermined time and copying the contents of the identified log memory to the emulated memory.

14. The method of claim 11, wherein the instructions for receiving the request to rewind the emulation comprise instructions operable to receive the request to rewind the emulation to a start time of a target time segment preceding the current time segment, and wherein the instructions for restoring the emulated memory further comprise instructions operable to cause the data processing equipment to:

identify a current log memory associated with the current time segment;

copy a content of each current log memory location marked valid to the emulated memory;

identify a log memory associated with each intervening time segment between the current time segment and the target time segment;

copy a content of each log memory location marked valid to the emulated memory for each identified log memory, the copying being performed in reverse time order of the identified log memories;

identify a target log memory associated with the target time segment; and copy a content of each target log memory location marked valid to the emulated memory.

15. The method of claim 11, wherein the time segments have an equal number of cycles or an unequal number of cycles.

* * * * *